(12) United States Patent
Zhao

(10) Patent No.: US 11,758,782 B2
(45) Date of Patent: Sep. 12, 2023

(54) FLEXIBLE DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Huihui Zhao, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 394 days.

(21) Appl. No.: 17/054,290

(22) PCT Filed: Jun. 23, 2020

(86) PCT No.: PCT/CN2020/097814
§ 371 (c)(1),
(2) Date: Nov. 10, 2020

(87) PCT Pub. No.: WO2021/217841
PCT Pub. Date: Nov. 4, 2021

(65) Prior Publication Data
US 2022/0157923 A1   May 19, 2022

(30) Foreign Application Priority Data
Apr. 27, 2020 (CN) .......................... 202010341431.X

(51) Int. Cl.
*H10K 59/131* (2023.01)
*H10K 59/124* (2023.01)
(Continued)

(52) U.S. Cl.
CPC ....... *H10K 59/1315* (2023.02); *H10K 59/124* (2023.02); *H10K 71/00* (2023.02);
(Continued)

(58) Field of Classification Search
None
See application file for complete search history.

(56) References Cited

U.S. PATENT DOCUMENTS

2018/0337223 A1\* 11/2018 Lee ..................... H01L 27/3276
2019/0386040 A1   12/2019 Wang et al.
(Continued)

FOREIGN PATENT DOCUMENTS

| CN | 107910335 A | 4/2018 |
| CN | 108231800 A | 6/2018 |

(Continued)

*Primary Examiner* — J. E. Schoenholtz
(74) *Attorney, Agent, or Firm* — PV IP PC; Wei Te Chung; Zhigang Ma

(57) ABSTRACT

The present invention provides a flexible display panel and a manufacturing method of the flexible display panel. The flexible display panel includes a base substrate, an inorganic layer, an organic filling layer, source/drain metal layer traces, and a planarization layer. The source/drain metal layer traces include a first source/drain metal layer trace in a bending region and a second source/drain metal layer trace in the non-bending region. The first source/drain metal layer trace is a curved trace which can reduce a resistance change of the source/drain metal layer trace caused by bending, and can reduce a risk of breakage.

12 Claims, 6 Drawing Sheets

(51) Int. Cl.
*H10K 71/00* (2023.01)
*H10K 77/10* (2023.01)
*H10K 59/12* (2023.01)
*H10K 102/00* (2023.01)

(52) U.S. Cl.
CPC ........ *H10K 77/111* (2023.02); *H10K 59/1201* (2023.02); *H10K 2102/311* (2023.02)

(56) References Cited

U.S. PATENT DOCUMENTS

| | | | |
|---|---|---|---|
| 2020/0013970 A1* | 1/2020 | Wang | H01L 27/3276 |
| 2020/0150725 A1 | 5/2020 | Saitoh et al. | |
| 2020/0185423 A1 | 6/2020 | Hu | |
| 2020/0341516 A1 | 10/2020 | Huang et al. | |
| 2021/0141480 A1* | 5/2021 | Kim | H01L 51/5203 |
| 2021/0336061 A1* | 10/2021 | Son | H01L 27/1244 |
| 2021/0408190 A1* | 12/2021 | Yang | H01L 27/3262 |

FOREIGN PATENT DOCUMENTS

| | | |
|---|---|---|
| CN | 109166880 A | 1/2019 |
| CN | 109360830 A | 2/2019 |
| CN | 109671719 A | 4/2019 |
| WO | 2019064534 A1 | 4/2019 |

\* cited by examiner

FLEXIBLE DISPLAY PANEL AND MANUFACTURING METHOD THEREOF

CROSS REFERENCE TO RELATED APPLICATIONS

This application is a National Phase of PCT Patent Application No. PCT/CN2020/097814 having International filing date of Jun. 23, 2020, which claims the benefit of priority of Chinese Application No. 202010341431.X filed on Apr. 27, 2020. The contents of the above applications are all incorporated by reference as if fully set forth herein in their entirety.

FIELD OF DISCLOSURE

The present invention relates to a field of display technology and in particular, to a flexible display panel and a manufacturing method thereof.

DESCRIPTION OF RELATED ART

In recent years, organic light-emitting diode (OLED) displays have received great attention and been used extensively due to advantages such as a high contrast ratio, wide viewing angles, and flexibility. Especially, the flexibility feature grabs attention from the majority of users. As the technology becomes mature, flexible and foldable displays also appear on the market.

The flexible and foldable display needs to be rolled or bent during use, and even frequently bent. As the number of bending increases, it is easy to cause the resistance of traces in the source/drain metal layer to increase, which leads to lower brightness of the display and broken traces in source/drain metal layer, thus causing poor display performance.

In summary, it is necessary to provide a new flexible display panel and a manufacturing method thereof to solve the above technical problems.

SUMMARY OF THE INVENTION

The present invention provides a flexible display panel and a manufacturing method thereof to solve the problem that with a continuous increase in the number of bending of a conventional flexible display panel, resistance of traces in a source/drain metal layer tends to increase, resulting in a decrease in brightness and broken traces in the source/drain metal layer.

To solve the above problems, the present invention provides a technical solution as follows:

The present invention provides a flexible display panel, comprising a bending region and a non-bending region, the flexible display panel comprising:

a base substrate;

an inorganic layer arranged on the base substrate;

an organic filling layer arranged on the inorganic layer, wherein the organic filling layer is made of polyimide;

source/drain metal layer traces disposed on the organic filling layer, wherein the source/drain metal layer traces comprise a first source/drain metal layer trace arranged in the bending region and a second source/drain metal layer trace arranged in the non-bending region, and the first source/drain metal layer trace is a curved trace; and a planarization layer arranged at one side of the source/drain metal layer traces away from the base substrate.

In the flexible display panel according to one embodiment of the present invention, the inorganic layer comprises:

a moisture barrier layer arranged on the base substrate;

a buffer layer arranged on the moisture barrier layer;

an active layer arranged on the buffer layer;

a first insulating layer covering the buffer layer and the active layer;

a first gate layer trace arranged on the first insulating layer;

a second insulating layer covering the first insulating layer and the first gate layer trace;

a second gate layer trace arranged on the second insulating layer; and an interlayer dielectric layer covering the second insulating layer and the second gate layer trace;

wherein the source/drain layer traces are disposed on the organic filling layer, the source/drain metal layer traces are connected to the active layer through a first via hole extended through the first insulating layer, the second insulating layer, and the interlayer dielectric layer, and the organic filling layer is arranged between the source/drain metal layer traces and the interlayer dielectric layer.

In the flexible display panel according to one embodiment of the present invention, the organic filling layer is provided with at least one groove structure arranged in an area corresponding to the bending region and disposed on one side away from the base substrate, and the first source/drain metal layer trace forms the curved trace through the at least one groove structure.

In the flexible display panel according to one embodiment of the present invention, wherein a bottom portion of the groove structure is in contact with the organic filling layer, and the first source/drain metal layer trace is arranged between the organic filling layer and the planarization layer.

In the flexible display panel according to one embodiment of the present invention, the groove structure penetrates the organic filling layer, and the first source/drain metal layer trace is arranged among the interlayer dielectric layer, the organic filling layer, and the planarization layer.

In the flexible display panel according to one embodiment of the present invention, an aperture diameter of the groove structure ranges from 2 um to 20 um.

In the flexible display panel according to one embodiment of the present invention, a cross-sectional shape of the groove structure comprises a trapezoid, a rectangle, a square, a circle, a diamond, or a triangle.

In the flexible display panel according to one embodiment of the present invention, the flexible display panel further comprises a second via hole defined in the bending region, and the second via hole is extended through the interlayer dielectric layer, the second insulating layer, the first insulating layer, and the buffer layer, and the organic filling layer is filled in the second via hole.

The present invention provides a flexible display panel which comprises a bending region and a non-bending region, the flexible display panel comprising:

a base substrate an inorganic layer arranged on the base substrate;

an organic filling layer arranged on the inorganic layer;

source/drain metal layer traces disposed on the organic filling layer, the source/drain metal layer traces comprising a first source/drain metal layer trace arranged in the bending region and a second source/drain metal layer trace arranged in the non-bending region; and a planarization layer arranged at one side of the source/drain metal layer away from the base substrate.

In the flexible display panel according to one embodiment of the present invention, the inorganic layer comprises:

a moisture barrier layer arranged on the base substrate;

a buffer layer arranged on the moisture barrier layer;

an active layer arranged on the buffer layer;

a first insulating layer covering the buffer layer and the active layer;

a first gate layer trace arranged on the first insulating layer;

a second insulating layer covering the first insulating layer and the first gate layer trace;

a second gate layer trace arranged on the second insulating layer; and an interlayer dielectric layer covering the second insulating layer and the second gate layer trace;

wherein the source/drain layer traces are disposed on the organic filling layer, the source/drain metal layer traces are connected to the active layer through a first via hole extended through the first insulating layer, the second insulating layer, and the interlayer dielectric layer, and the organic filling layer is arranged between the source/drain metal layer traces and the interlayer dielectric layer.

In the flexible display panel according to one embodiment of the present invention, the organic filling layer is provided with at least one groove structure arranged in an area corresponding to the bending region and disposed on one side away from the base substrate, and the first source/drain metal layer trace forms a curved trace through the groove structure.

In the flexible display panel according to one embodiment of the present invention, a bottom portion of the groove structure is in contact with the organic filling layer, and the first source/drain metal layer trace is arranged between the organic filling layer and the planarization layer.

In the flexible display panel according to one embodiment of the present invention, the groove structure penetrates the organic filling layer, and the first source/drain metal layer trace is arranged among the interlayer dielectric layer, the organic filling layer, and the planarization layer.

In the flexible display panel according to one embodiment of the present invention, an aperture diameter of the groove structure ranges from 2 um to 20 um.

In the flexible display panel according to one embodiment of the present invention, a depth of the groove structure ranges from 0.5 um to 1.5 um.

In the flexible display panel according to one embodiment of the present invention, a cross-sectional shape of the groove structure comprises a trapezoid, a rectangle, a square, a circle, a diamond, or a triangle.

In the flexible display panel according to one embodiment of the present invention, the flexible display panel further comprises a second via hole defined in the bending region, the second via hole is extended through the interlayer dielectric layer, the second insulating layer, the first insulating layer, and the buffer layer, and the organic filling layer is filled in the second via hole.

In the flexible display panel according to one embodiment of the present invention, the buffer layer is made of silicon nitride or silicon oxide.

The present invention provides a manufacturing method of a flexible display panel, comprising following steps:

S10: providing a base substrate;

S20: forming an inorganic layer on the base substrate;

S30: forming an organic filling layer on the inorganic layer, and patterning the organic filling layer, so that the organic filling layer forms at least one groove structure arranged in an area corresponding to the bending region and disposed on one side away from the base substrate;

S40: forming source/drain metal layer traces on the organic filling layer, and patterning the source/drain metal layer to form a first source/drain metal layer trace in the bending region and a second source/drain metal layer trace in the non-bending region, wherein the first source/drain metal layer trace forms a curved trace through the groove structure; and S50: forming a planarization layer on the source/drain metal layer trace.

In the manufacturing method of the flexible display panel, step S20 comprises following steps:

S201: sequentially forming a moisture barrier layer, a buffer layer, an active layer, a first insulating layer, a first gate layer trace, a second insulating layer, a second gate layer trace, and an interlayer dielectric layer on the base substrate; and S202: forming a second via hole extended through the first insulating layer, the second insulating layer, and the interlayer dielectric layer.

In the flexible display panel and the manufacturing method thereof provided by the present invention, the source/drain metal layer trace is a curved trace, so that when the flexible display panel is bent, the source/drain metal layer trace is subjected to alternate compressive stress and tensile stress, and the compressive stress and tensile stress can neutralize each other. Accordingly, the stress is reduced, thereby reducing a resistance change of the source/drain metal layer trace caused by bending, and further reducing an optical change caused by the resistance change. At the same time, the present invention can reduce a risk of breakage of the source/drain metal layer trace and improve product performance of the flexible display panel.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
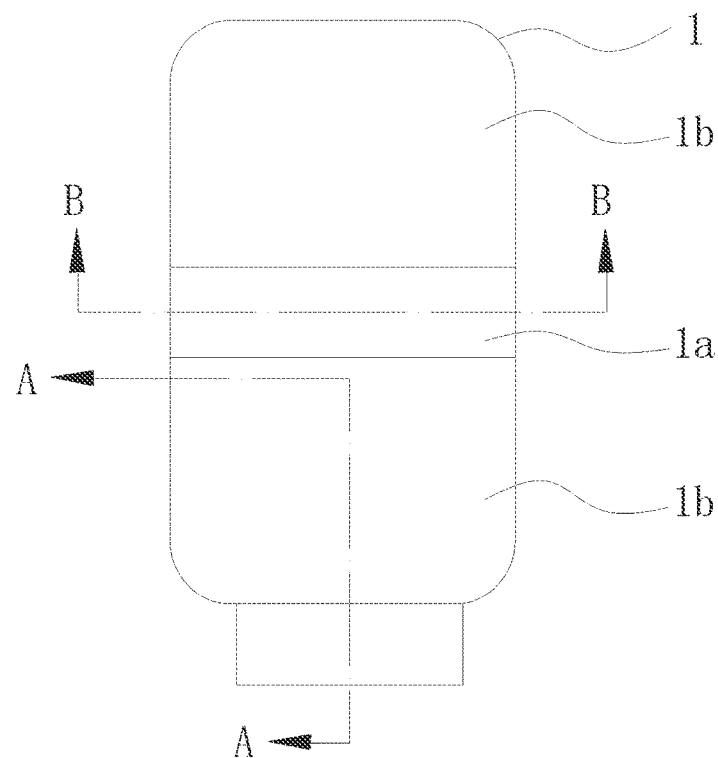
FIG. 1 is a schematic plan view illustrating a structure of a flexible display panel according to one embodiment of the present invention.

A description is provided below with reference to the accompanying drawings to illustrate specific embodiments of the present invention. The directional terms mentioned in the present invention, such as "upper", "lower", "front", "rear", "left", "right", "inner", "outer", and "lateral", are for illustrative purposes based on the accompanying drawings. Therefore, the directional terms are only used to describe and understand the present invention, rather than to limit the present invention. In the drawings, structurally similar elements are indicated by the same reference numerals.

The present invention solves a problem with a conventional flexible display panel. The problem is that, as the number of bending increases, resistance of traces of a source/drain metal layer tends to increase, resulting in a decrease in brightness and breakage of the traces of the source/drain metal layer. The present invention can solve this problem.

As shown in FIG. 1, a flexible display panel 1 is provided according to one embodiment of the present invention. The flexible display panel 1 includes a display region. An integrated chip and a flexible circuit board are arranged at an edge of the display region. The display region comprises a bending region 1a and a non-bending region 1b. The bending region 1a refers to an area that needs to be bent or folded. The non-bending region 1b refers to an area that does not need to be bent or folded. The bending region 1a and the non-bending region 1b both can be used to display images. The bending region 1a can be arranged at any position of the display region. In consideration of user habits, the bending region 1a of the present embodiment is arranged in the middle of the display region, and the flexible display panel 1 can be bent or folded along a bending axis of the bending region 1a.

Figure 2:
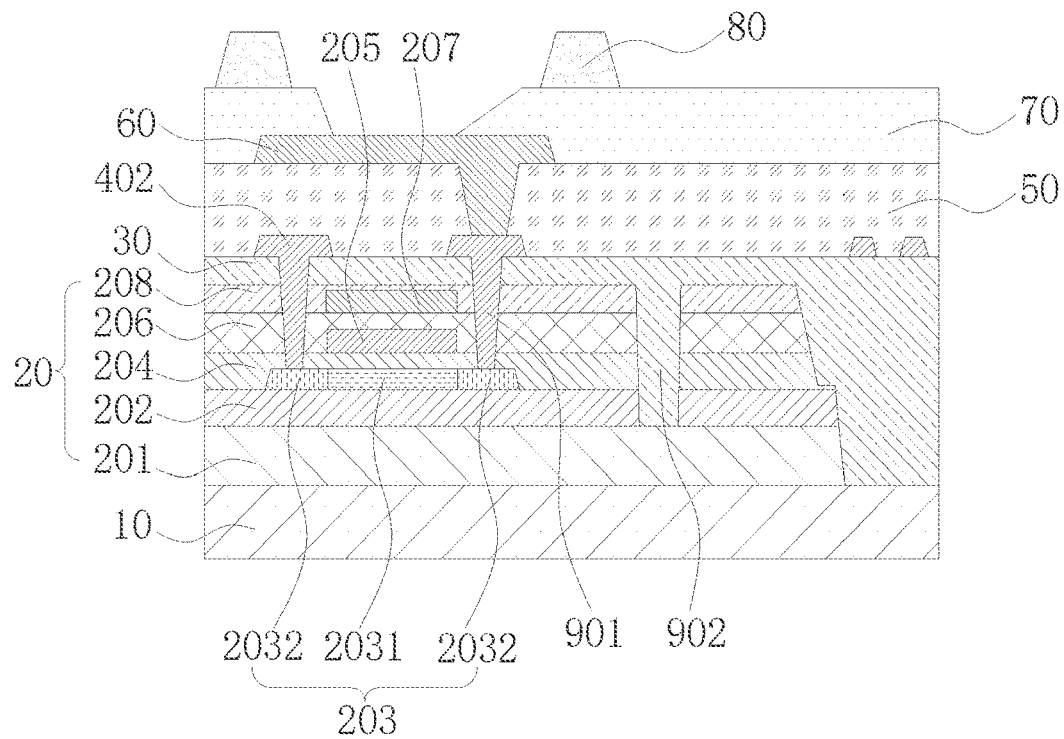
FIG. 2 is a schematic cross-sectional view, taken along line A-A, illustrating the flexible display panel according to one embodiment of the present invention.
Figure 3:
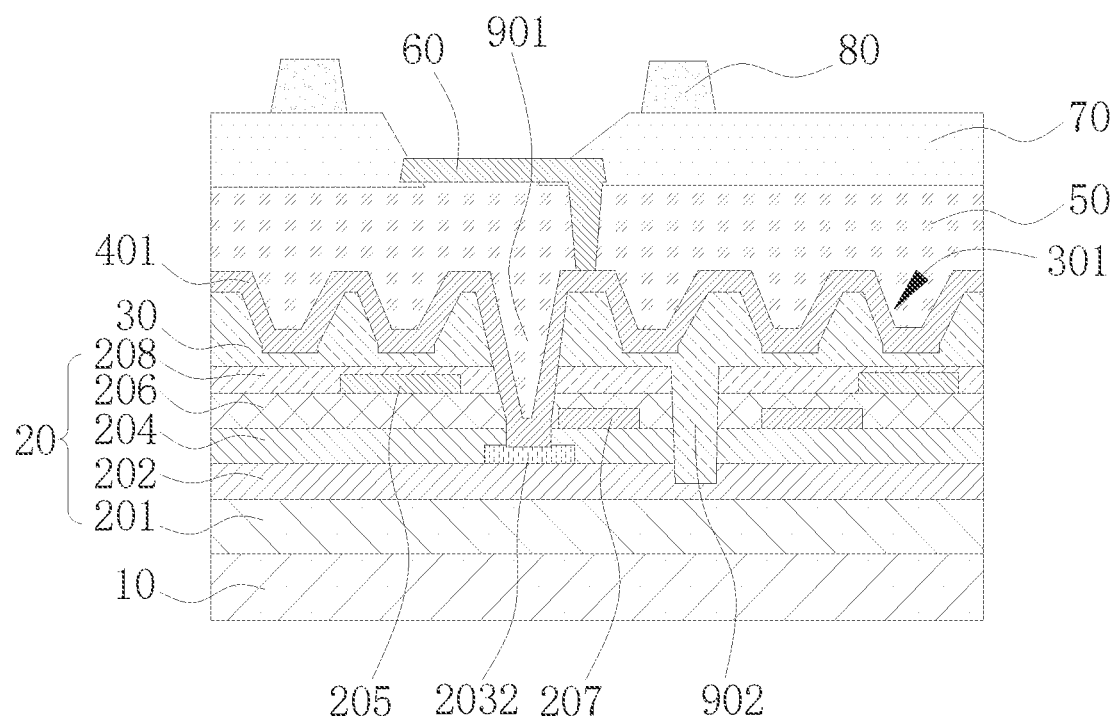
FIG. 3 is a schematic cross-sectional view, taken along line B-B, illustrating a flexible display panel according to one embodiment of the present invention.

As shown in FIGS. 2 and 3, structurally, the flexible display panel 1 comprises an array substrate, and the array substrate comprises a base substrate 10. The base substrate 10 is a flexible substrate, which can be made of a polyamide material.

An inorganic layer 20 is arranged on the base substrate 10. It should be noted that the inorganic layer 20 comprises, but is not limited to, a moisture barrier layer (an oxygen and moisture barrier layer) 201, a buffer layer 202, an active layer 203, a first insulating layer 204, a first gate layer trace 205, a second insulating layer 206, a second gate layer trace 207, and an interlayer dielectric layer 208. In the present embodiment, the inorganic layer 20 comprises: the moisture barrier layer 201 arranged on the base substrate 10, wherein the moisture barrier layer 201 is configured to prevent external moisture or oxygen from corroding a device layer of the flexible display panel 1; the buffer layer 202 arranged on the moisture barrier layer 201, wherein the buffer layer 202 can be made of silicon nitride or silicon oxide for buffering and protection; the active layer 203 arranged on the buffer layer 202, wherein the active layer 203 can be made of polysilicon or amorphous silicon, and the active layer 203 comprises a semiconductor region 2031 arranged in the middle and doped regions 2032 arranged at two ends of the semiconductor region 2031; the first insulating layer 204 covering the buffer layer 202 and the active layer 203; the first gate layer trace 205 arranged on the first insulating layer 204; the second insulating layer 206 covering the first insulating layer 204 and the first gate layer trace 205; the second gate layer trace 207 arranged on the second insulating layer 206; and the interlayer dielectric layer 208 covering the second insulating layer 206 and the second gate layer trace 207.

In detail, the first gate layer trace 205 and the second gate layer trace 207 can be made of metals or alloys containing molybdenum, copper, and etc. The first insulating layer 204, the second insulating layer 206, and the interlayer dielectric layer 208 can be made of silicon oxide, silicon nitride, or other materials.

An organic filling layer 30 is arranged on the inorganic layer 20, and the organic filling layer 30 can be made of a flexible organic material such as PI. Source/drain metal layer traces are arranged on the organic filling layer 40. The source/drain metal layer trace includes a first source/drain metal layer trace 401 located in the bending region 1a and a second source/drain metal layer trace 402 located in the non-bending region 1b. The source/drain metal layer trace can be made of metals or alloys containing molybdenum, copper, and etc. The source/drain metal layer trace is connected to the doped region 2032 of the active layer 203 through a first via hole 901 extended through the first insulating layer 204, the second insulating layer 206, and the interlayer dielectric layer 208. The organic filling layer 30 is arranged between the source/drain metal layer trace and the interlayer dielectric layer 208.

Because molybdenum and copper have lower hardness, when the flexible display panel 1 is bent, the first source/drain metal layer trace 401 tends to break. At the same time, as the number of bending increases, it is easy to cause the resistance of the first source/drain metal layer trace 401 to increase, resulting in a decrease in the brightness. Therefore, the first source/drain metal layer trace 401 located in the bending region 1a is designed as a curved trace, so that the first source/drain metal layer trace 401 receives alternate compressive stress and tensile stress, and the compressive stress and the tensile stress can neutralize each other, which effectively reduces a risk of trace breakage, and at the same time, reduces an optical change caused by the resistance change of the first source/drain metal layer trace 401 to improve product performance.

Furthermore, in the present embodiment, the organic filling layer 30 is provided with at least one groove structure 301 arranged in an area corresponding to the bending region 1a and disposed on one side away from the base substrate 10, and the first source/drain metal layer trace 401 forms the curved trace through the groove structure 301.

In one embodiment, as shown in FIG. 3, the groove structure 301 does not completely penetrate the organic filling layer 30, and a bottom of the groove structure 301 is in contact with the organic filling layer 30. The first source/drain metal layer trace 401 is disposed between the organic filling layer 30 and the planarization layer 50. The planarization layer 50 is arranged on the source/drain metal layer trace.

Figure 4:
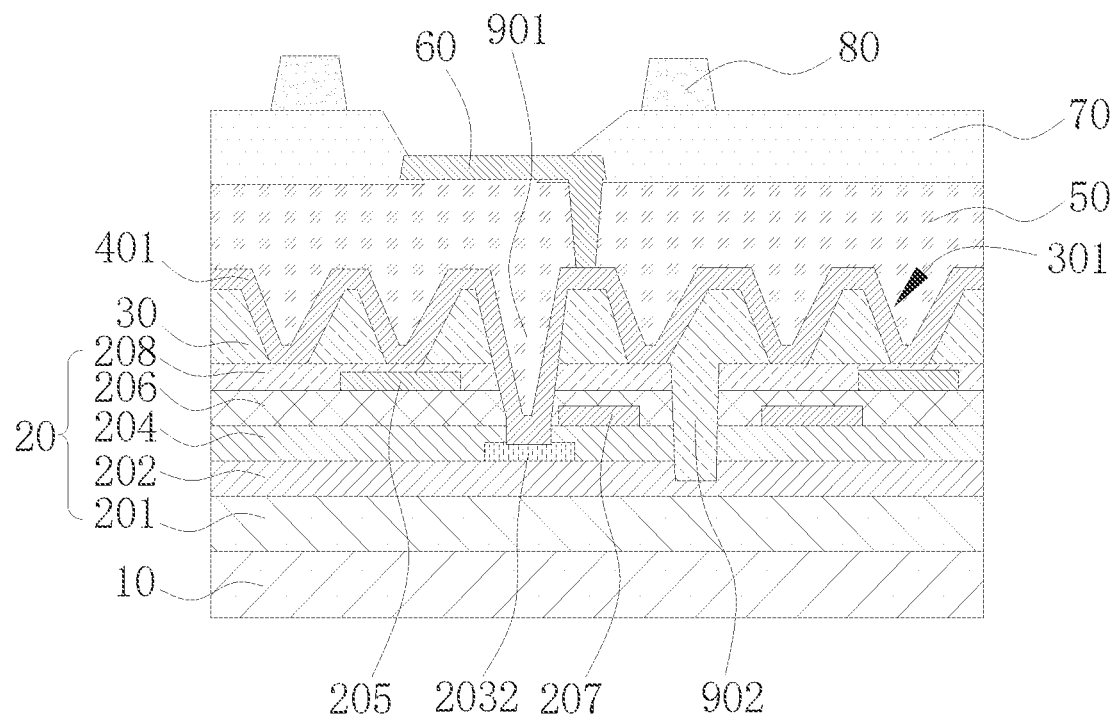
FIG. 4 is a schematic cross-sectional view, taken along line B-B, illustrating the flexible display panel according to one embodiment of the present invention.

Preferably, in another embodiment, as shown in FIG. 4, the groove structure 301 completely penetrates the organic filling layer 30, and the first source/drain metal layer trace 401 is arranged among the interlayer dielectric layer 208, the organic filling layer 30, and the planarization layer 50.

The groove structure 301 includes crests and troughs. When the flexible display panel 1 is folded inward (bent to one side close to the base substrate 10), the first source/drain metal layer trace 401 is subjected to tensile stress at the crests of the groove structure 301 and compressive stress at the troughs of the groove structure 301, so the tensile stress and the compressive stress at the crests and the troughs can neutralize each other. Similarly, the tensile stress and the compressive stress of the first source/drain metal layer trace 401 at the crests and troughs can neutralize each other. When the flexible display panel 1 is folded outward (bent toward one side away from the base substrate 10), the first source/drain metal layer trace 401 is subjected to compressive stress at the crests of the groove structure 301 and tensile stress at the troughs of the groove structure 301. Therefore, the compressive stress and the tensile stress at the crests and the troughs can neutralize each other, thereby reducing overall stress on the first source/drain metal layer trace 401.

Specifically, when the flexible display panel 1 is bent, positions of the bending region 1a are subjected to uniform stress, so the groove structures 30 are evenly spaced in a direction perpendicular to the axis of the bending region 1a. In one embodiment of the present invention, a thickness of the organic filling layer 30 is 1.5 um, an aperture diameter of the groove structure 301 ranges from 2 um to 20 um, and a depth of the groove structure 301 ranges from 0.5 um to 1.5 um. It should be noted that the thickness of the organic filling layer 30, the aperture diameter of the groove structure 301, and the depth of the groove structure 301 can be designed according to actual conditions of the flexible display panel 1.

In detail, a cross-sectional shape of the groove structure 301 comprises a trapezoid, a rectangle, a square, a circle, a diamond, a triangle, or a special shape. However, the present invention is not intended to limit the cross-sectional shape of the groove structure 301.

Furthermore, the flexible display panel 1 further comprises a second via hole 902 arranged in the bending region 1a, and the second via hole 902 penetrates the interlayer dielectric layer 208, the second insulating layer 206, the first insulating layer 204, and the buffer layer 202. The organic filling layer 30 is filled in the second via hole 902. The organic filling layer 30 can adjust stress between the upper and lower film layers in the inorganic layer 20, and can spread the stress of the inorganic layer 20 during bending to thereby prevent breakage of the first source/drain metal layer trace 401.

The flexible display panel 1 further comprises an anode layer 60 disposed on the planarization layer 50, a pixel definition layer 70, and a spacer layer 80 disposed on the pixel definition layer 70, wherein a light-emitting layer is arranged in an opening area of the pixel definition layer 70.

Figure 5:
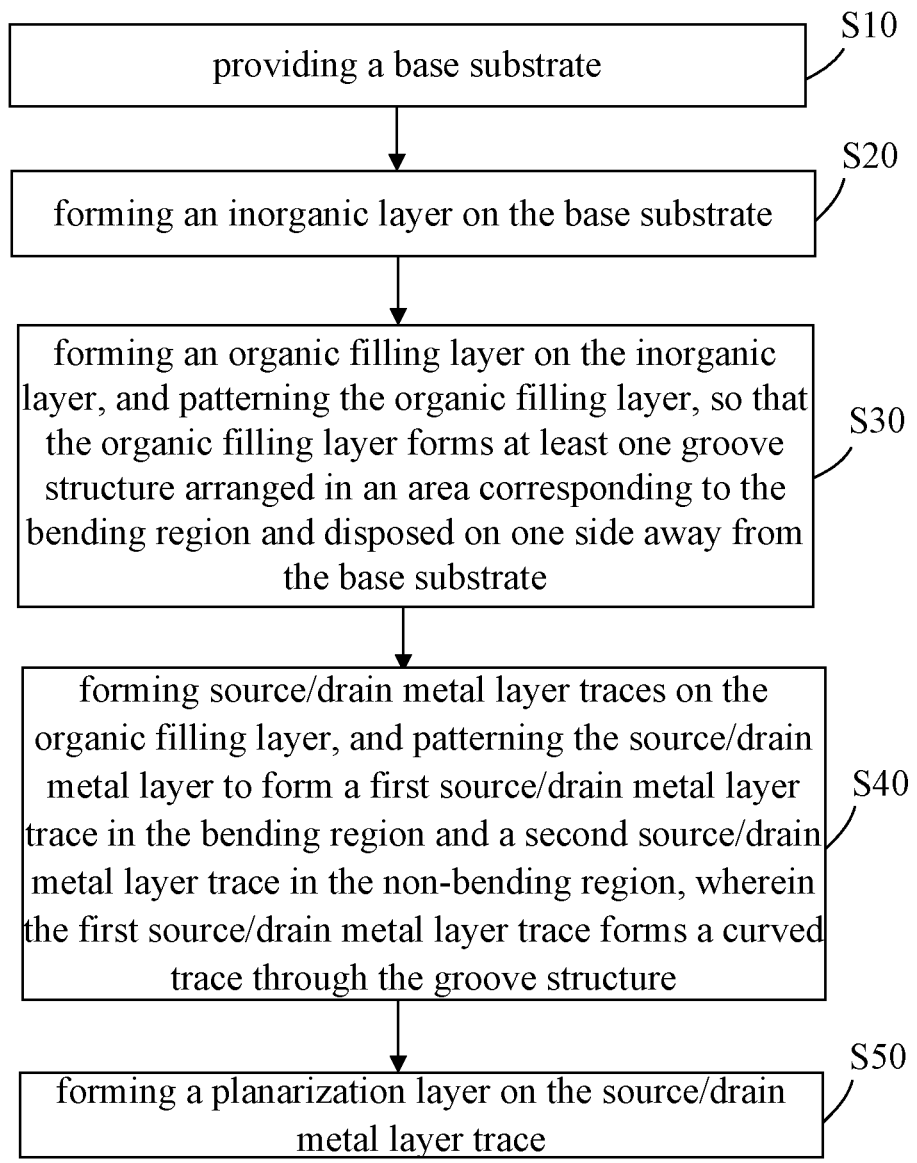
FIG. 5 is a process flow diagram illustrating a manufacturing method of the flexible display panel according to one embodiment of the present invention.
Figure 6A:
FIGS. 6A to 6G are schematic views illustrating the manufacturing method of the flexible display panel according to one embodiment of the present invention.

As shown in FIG. 5, a manufacturing method of a flexible display panel 1 is provided according to one embodiment of the present invention. The manufacturing method comprises the following steps:

As shown in FIG. 6A, step S10: providing a base substrate 10.

The base substrate 10 is flexible substrate.

Step S20: forming an inorganic layer 20 on the base substrate 10.

Figure 6B:
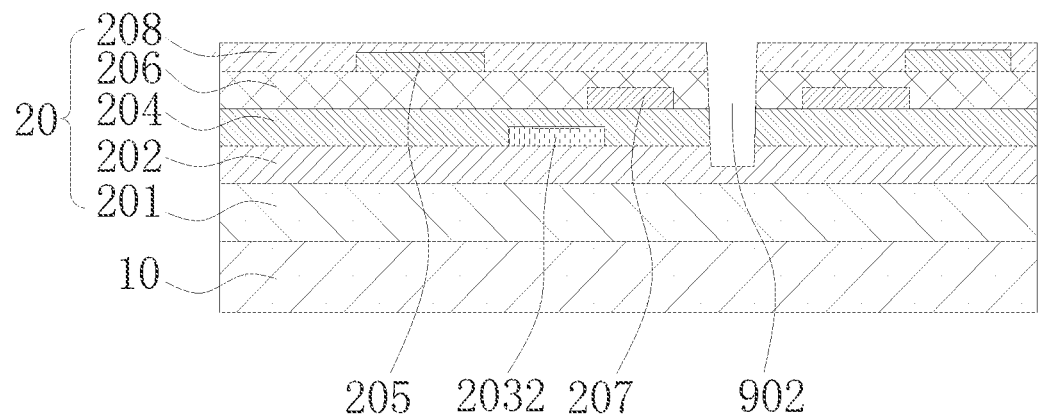

Referring to FIG. 6B, step S20 comprises the following steps:

S201: sequentially forming a moisture barrier layer 201, a buffer layer 202, an active layer 203, a first insulating layer 204, a first gate layer trace 205, a second insulating layer 206, a second gate layer trace 207, and an interlayer dielectric layer 208 on the base substrate 10.

First, the moisture barrier layer 201 and the buffer layer 202 can be formed by chemical vapor deposition, and then the active layer 203 can be formed by crystallization, exposure, and etching by performing an excimer laser annealing method. Next, the first insulating layer 204 can be formed by chemical vapor deposition. After that, a first metal layer is formed by radio frequency sputtering, and exposed and etched to form the first gate layer trace 205. Afterwards, the second insulating layer 206 is formed by chemical vapor deposition; a second metal layer is formed by radio frequency sputtering, and exposed and etched to form the second gate layer trace 207. Finally, the interlayer dielectric layer 208 is formed by chemical vapor deposition.

Step S202: forming a second via hole 902 extended through the first insulating layer 204, the second insulating layer 206, and the interlayer dielectric layer 208.

The first insulating layer 204, the second insulating layer 206, and the interlayer dielectric layer 208 are exposed and developed to form the second via hole 902.

Figure 6C:
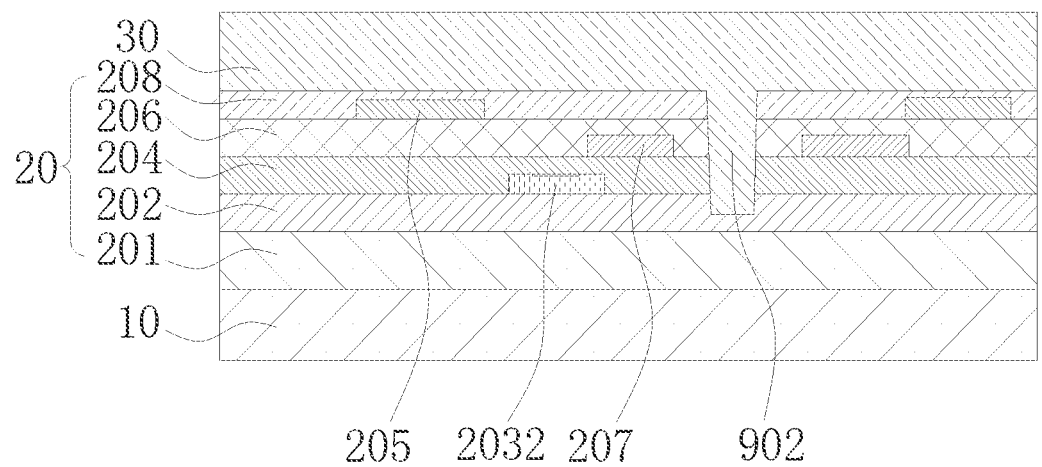
Figure 6D:
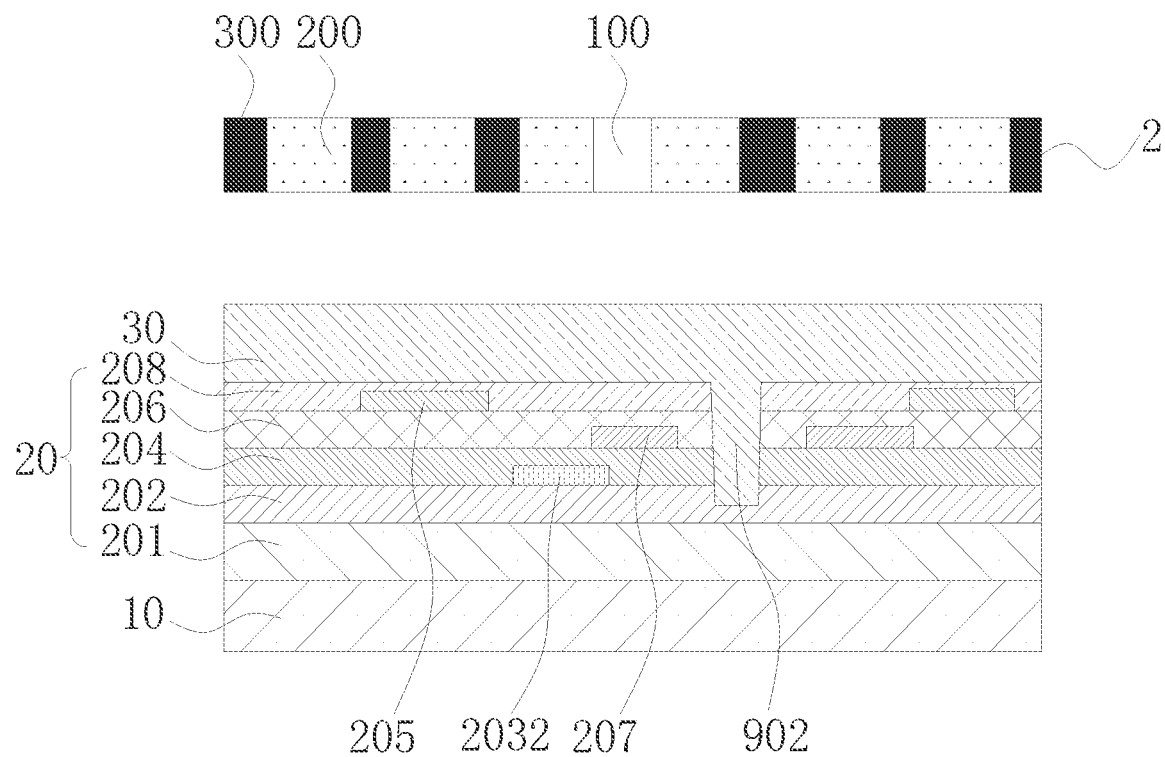
Figure 6E:
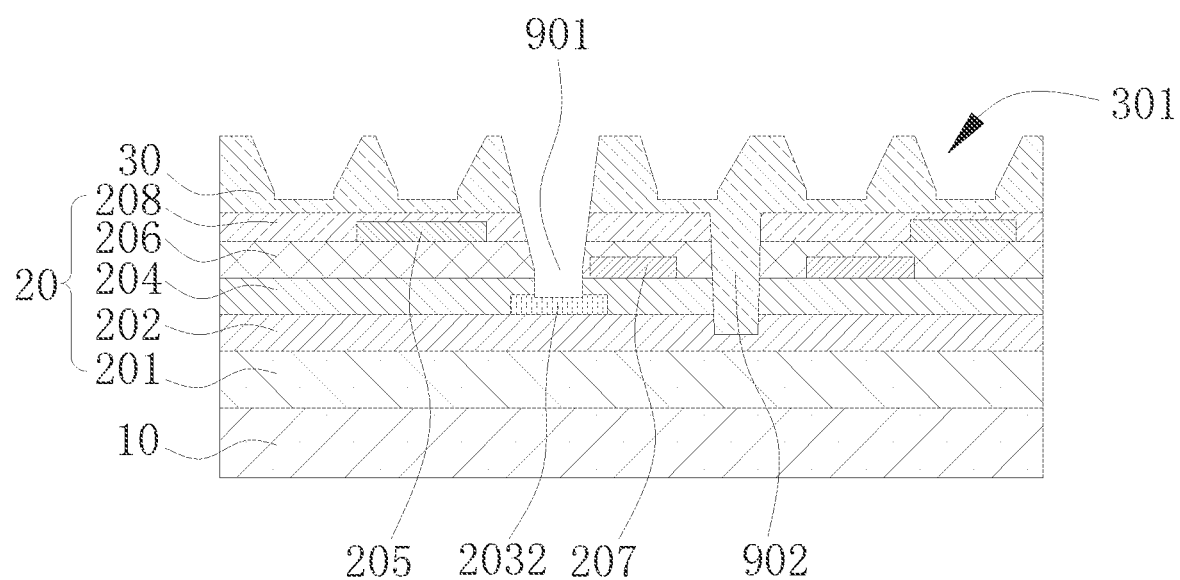

As shown in FIGS. 6C, 6D, and 6E, step S30: forming an organic filling layer 30 on the inorganic layer 20, and patterning the organic filling layer 30, so that the organic filling layer 30 forms at least one groove structure 301 in an area corresponding to the bending region 1a and on one side away from the base substrate 10.

The organic filling layer 30 can be formed on the interlayer dielectric layer 208 by coating, and the organic filling layer 30 can be exposed by using a halftone mask 2. The halftone mask 2 comprises a light-transmissive region 100, a semi-transmissive region 200, and a non-transmissive region 300. The light-transmissive region 100 is arranged corresponding to an area where the first via hole 901 needs to be formed in the flexible display panel 1, the semi-transmissive region 200 is arranged corresponding to an area where the groove structure 301 needs to be formed in the flexible display panel 1, and the non-transmissive region 300 is arranged corresponding to the rest area of the flexible display panel 1.

The halftone mask 2 can be used to make the first via hole 901 and the groove structure 301 at the same time, thus saving manufacturing steps and improving production efficiency. Certainly, another mask with a different structure can be used to prepare the first via hole 901 and the groove structure 301 successively, and a detailed description thereof is not provided here for brevity.

Specifically, a thickness of the organic filling layer 30 is 1.5 um, an aperture diameter of the groove structure 301 ranges from 2 um to 20 um, a depth of the groove structure 301 ranges from 0.5 um to 1.5 um, and the groove structure 301 completely penetrates or does not completely penetrate the organic filling layer 30; a cross-sectional shape of the groove structure 301 is a trapezoid, a rectangle, a square, a circle, a diamond, a triangle, or a special shape (e.g., an irregular hole).

Figure 6F:
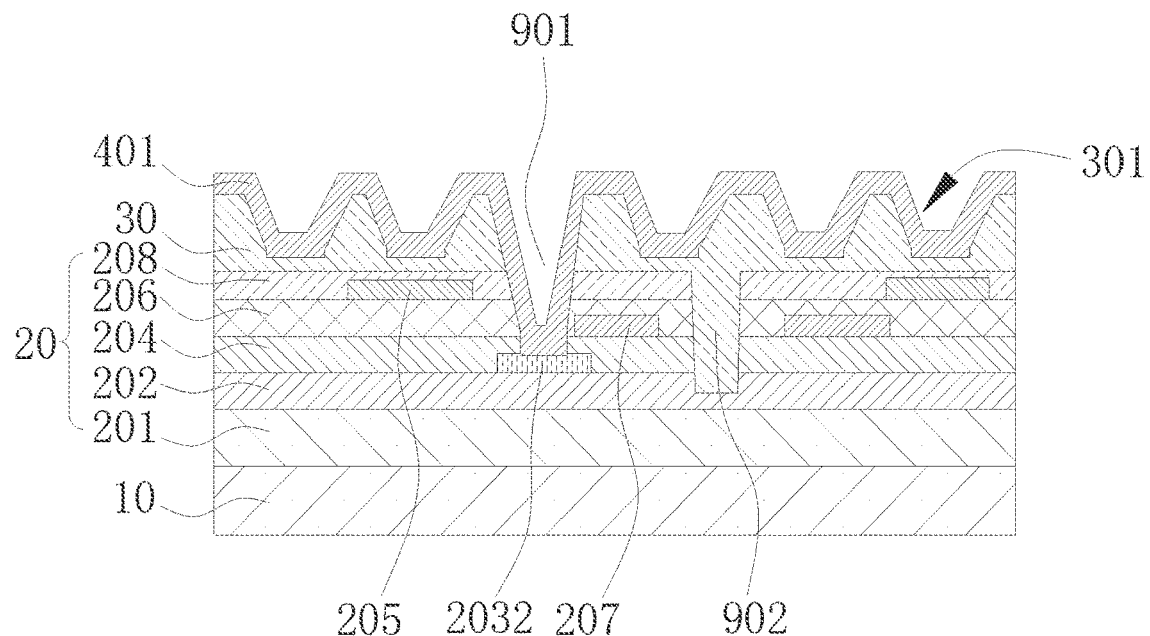

As shown in FIG. 6F, step S40: forming a source/drain metal layer on the organic filling layer 30, and patterning the source/drain metal layer to form a first source/drain metal layer trace 401 in the bending region 1a and a second source/drain metal layer trace 402 in the non-bending region 1b, wherein the first source/drain metal layer trace 401 forms a curved trace through the groove structure 301.

The source/drain metal layer trace can be formed by sputtering.

It should be noted that in step S40, patterning the organic filling layer 30 includes exposure, development, etching, and etc., which can also form the first via hole 901 penetrating the first insulating layer 204, the second insulating layer 206, and the interlayer dielectric layer 208, wherein the first via hole 901 is connected to the active layer 203.

Figure 6G:
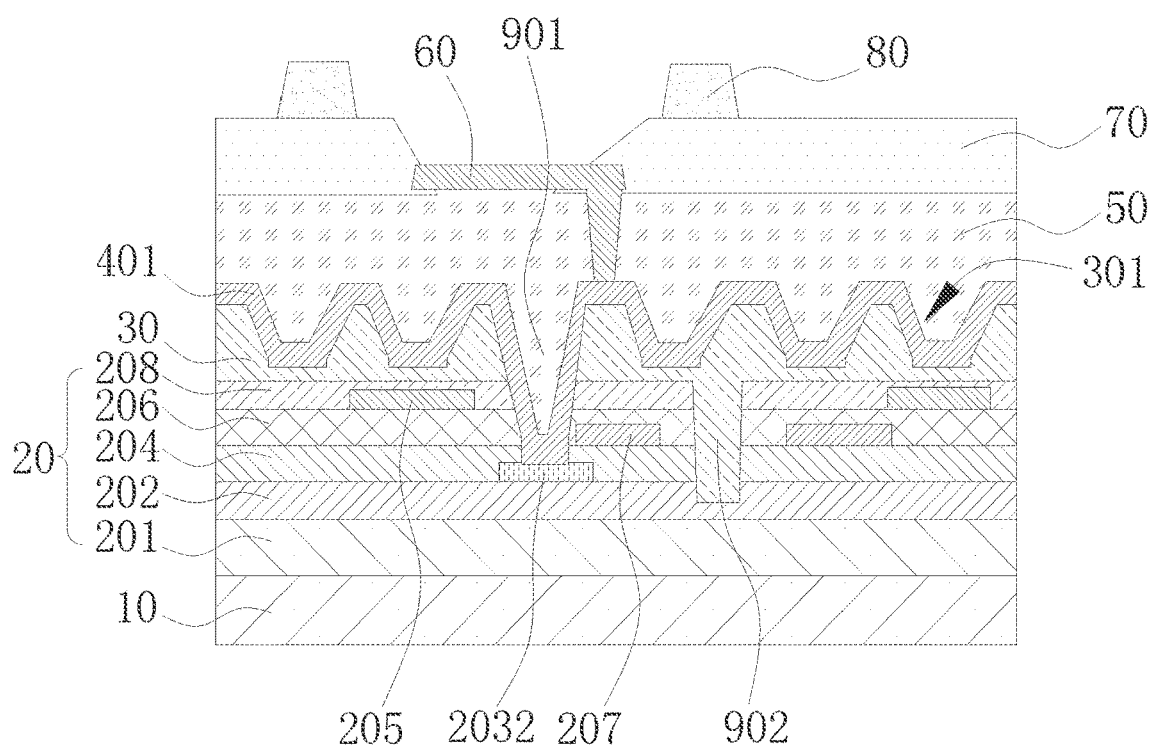

As shown in FIG. 6G, step S50: forming a planarization layer 50 on the source/drain metal layer traces.

At the same time, the manufacturing method of the flexible display panel 1 further comprises forming an anode layer 60, a pixel definition layer 70, and a spacer layer 80 on the planarization layer 50, and the anode layer 60 is connected to the source/drain metal layer trace through the via hole.

Advantages of the present invention: In the flexible display panel 1 and the manufacturing method thereof provided by the present invention, the source/drain metal layer trace is designed as a curved trace, so that when the flexible display panel 1 is bent, the source/drain metal layer trace is subjected to alternate compressive stress and tensile stress, and thereby the compressive stress and the tensile stress can neutralize each other to reduce the stress. Such a configuration reduces the resistance change of the source/drain metal layer trace caused by bending, thereby reducing the optical change caused by the resistance change. At the same time, the present invention can reduce the risk of breakage of the source/drain metal layer trace, and improve the product performance of the flexible display panel 1.

In summary, although the present invention has been disclosed in preferable embodiments as above, the above-mentioned embodiments are not intended to limit the present invention. Persons of ordinary skill in the art can make various modifications and changes. Such changes and modifications are deemed to be within the protection scope of the present invention defined by the appended claims.

What is claimed is:

1. A flexible display panel, comprising a bending region and a non-bending region, the flexible display panel comprising:
    a base substrate;
    an inorganic layer arranged on the base substrate, wherein the inorganic layer comprises:
    a moisture barrier layer arranged on the base substrate;
    a buffer layer arranged on the moisture barrier layer;
    an active layer arranged on the buffer layer;
    a first insulating layer covering the buffer layer and the active layer;
    a first gate layer trace arranged on the first insulating layer;
    a second insulating layer covering the first insulating layer and the first gate layer trace;
    a second gate layer trace arranged on the second insulating layer; and
    an interlayer dielectric layer covering the second insulating layer and the second gate layer trace;
    an organic filling layer arranged on the inorganic layer, wherein the organic filling layer is made of polyimide and is provided with at least one groove structure arranged in an area corresponding to the bending region and disposed on one side away from the base substrate;
    source/drain metal layer traces disposed on the organic filling layer, wherein the source/drain metal layer traces comprise a first source/drain metal layer trace arranged in the bending region and a second source/drain metal layer trace arranged in the non-bending region, and the first source/drain metal layer trace is a curved trace, wherein the source/drain metal layer traces are connected to the active layer through a first via hole extended through the first insulating layer, the second insulating layer, and the interlayer dielectric layer, and the organic filling layer is arranged between the source/drain metal layer traces and the interlayer dielectric layer, wherein the first source/drain metal layer trace forms the curved trace through the at least one groove structure, the groove structure penetrates the organic filling layer, and the first source/drain metal layer trace is arranged among the interlayer dielectric layer, the organic filling layer, and the planarization layer; and
    a planarization layer arranged at one side of the source/drain metal layer traces away from the base substrate.

2. The flexible display panel according to claim 1, wherein a bottom portion of the groove structure is in contact with the organic filling layer, and the first source/drain metal layer trace is arranged between the organic filling layer and the planarization layer.

3. The flexible display panel according to claim 1, wherein an aperture diameter of the groove structure ranges from 2 um to 20 um.

4. The flexible display panel according to claim 1, wherein the flexible display panel further comprises a second via hole defined in the bending region, and the second via hole is extended through the interlayer dielectric layer, the second insulating layer, the first insulating layer, and the buffer layer, and the organic filling layer is filled in the second via hole.

5. A flexible display panel, comprising a bending region and a non-bending region, the flexible display panel comprising:
    a base substrate;
    an inorganic layer arranged on the base substrate, wherein the inorganic layer comprises:
    a moisture barrier layer arranged on the base substrate;
    a buffer layer arranged on the moisture barrier layer;
    an active layer arranged on the buffer layer;
    a first insulating layer covering the buffer layer and the active layer;
    a first gate layer trace arranged on the first insulating layer;
    a second insulating layer covering the first insulating layer and the first gate layer trace;
    a second gate layer trace arranged on the second insulating layer; and
    an interlayer dielectric layer covering the second insulating layer and the second gate layer trace;
    an organic filling layer arranged on the inorganic layer, wherein the organic filling layer is provided with at least one groove structure arranged in an area corresponding to the bending region and disposed on one side away from the base substrate;
    source/drain metal layer traces disposed on the organic filling layer, the source/drain metal layer traces comprising a first source/drain metal layer trace arranged in the bending region and a second source/drain metal layer trace arranged in the non-bending region, wherein the source/drain layer traces are disposed on the organic filling layer, the source/drain metal layer traces are connected to the active layer through a first via hole extended through the first insulating layer, the second insulating layer, and the interlayer dielectric layer, the organic filling layer is arranged between the source/drain metal layer traces and the interlayer dielectric layer, and the first source/drain metal layer trace forms the curved trace through the at least one groove structure, wherein the groove structure penetrates the organic filling layer, and the first source/drain metal layer trace is arranged among the interlayer dielectric layer, the organic filling layer, and the planarization layer; and
    a planarization layer arranged at one side of the source/drain metal layer away from the base substrate.

6. The flexible display panel according to claim 5, wherein a bottom portion of the groove structure is in contact with the organic filling layer, and the first source/drain metal layer trace is arranged between the organic filling layer and the planarization layer.

7. The flexible display panel according to claim 5, wherein an aperture diameter of the groove structure ranges from 2 um to 20 um.

8. The flexible display panel according to claim 5, wherein a depth of the groove structure ranges from 0.5 um to 1.5 um.

9. The flexible display panel according to claim 5, wherein the flexible display panel further comprises a second via hole defined in the bending region, the second via hole is extended through the interlayer dielectric layer, the second insulating layer, the first insulating layer, and the buffer layer, and the organic filling layer is filled in the second via hole.

10. The flexible display panel according to claim 5, wherein the buffer layer is made of silicon nitride or silicon oxide.

11. A manufacturing method of a flexible display panel, comprising following steps:
    S10: providing a base substrate;
    S20: forming an inorganic layer on the base substrate;
    S30: forming an organic filling layer on the inorganic layer, and patterning the organic filling layer, so that the organic filling layer forms at least one groove structure arranged in an area corresponding to the bending region and disposed on one side away from the base substrate;
    S40: forming source/drain metal layer traces on the organic filling layer, and patterning the source/drain metal layer to form a first source/drain metal layer trace in the bending region and a second source/drain metal layer trace in the non-bending region, wherein the source/drain metal layer traces are connected to the active layer through a first via hole extended through the first insulating layer, the second insulating layer, and the interlayer dielectric layer, and the organic filling layer is arranged between the source/drain metal layer traces and the interlayer dielectric layer, wherein the first source/drain metal layer trace forms a curved trace through the groove structure, and the first source/drain metal layer trace is formed among the interlayer dielectric layer, the organic filling layer, and the planarization layer; and
    S50: forming a planarization layer on the source/drain metal layer trace;
    wherein step S20 comprises following steps:
    S201: sequentially forming a moisture barrier layer, a buffer layer, an active layer, a first insulating layer, a first gate layer trace, a second insulating layer, a second gate layer trace, and an interlayer dielectric layer on the base substrate, wherein the first insulating layer covers the buffer layer and the active layer, the second insulating layer covers the first insulating layer and the first gate layer trace, and the interlayer dielectric layer covers the second insulating layer and the second gate layer trace.

12. The manufacturing method of the flexible display panel according to claim 11, wherein step S20 comprises following steps:
    S202: forming a second via hole extended through the first insulating layer, the second insulating layer, and the interlayer dielectric layer.

* * * * *